United States Patent
Ishii (10) Patent No.: US 7,677,105 B2
(45) Date of Patent: Mar. 16, 2010

(54) DOUBLE-ENDED TUNING FORK TYPE PIEZOELECTRIC RESONATOR AND PRESSURE SENSOR

(75) Inventor: Osamu Ishii, Koza-gun (JP)

(73) Assignee: Epson Toyocom Corporation, Tokyo (JP)

( * ) Notice: Subject to any disclaimer, the term of this patent is extended or adjusted under 35 U.S.C. 154(b) by 70 days.

(21) Appl. No.: 12/066,060

(22) PCT Filed: Sep. 25, 2006

(86) PCT No.: PCT/JP2006/319629

§ 371 (c)(1),
(2), (4) Date: Mar. 6, 2008

(87) PCT Pub. No.: WO2007/035004

PCT Pub. Date: Mar. 29, 2007

(65) Prior Publication Data

US 2009/0151461 A1    Jun. 18, 2009

(30) Foreign Application Priority Data

Sep. 26, 2005    (JP) ................. 2005-278932

(51) Int. Cl.
*G01L 11/00* (2006.01)
(52) U.S. Cl. ................. 73/708; 73/715; 73/721; 73/753
(58) Field of Classification Search ............... None
See application file for complete search history.

(56) References Cited

U.S. PATENT DOCUMENTS

| | | |
|---|---|---|
| 4,406,966 A | 9/1983 | Paros |
| 4,507,970 A * | 4/1985 | Dinger ................. 73/702 |
| 4,562,375 A | 12/1985 | Besson et al. |
| 4,623,813 A * | 11/1986 | Naito et al. ............. 310/313 R |
| 4,776,924 A * | 10/1988 | Delapierre .............. 438/52 |
| 5,165,289 A * | 11/1992 | Tilmans .................. 73/862.59 |
| 5,290,102 A * | 3/1994 | Kaiser et al. ............ 374/120 |

(Continued)

FOREIGN PATENT DOCUMENTS

JP       A-55-60832        5/1980

(Continued)

*Primary Examiner*—Lisa M Caputo
*Assistant Examiner*—Jermaine Jenkins
(74) *Attorney, Agent, or Firm*—Oliff & Berridge, PLC (57) ABSTRACT

To provide a double-ended tuning fork type piezoelectric resonator that includes: a piezoelectric element having two arm portions disposed in parallel, a first supporting portion that support one ends of each of the arm portions, a second supporting portion that support the other ends of each of the arm portions; and an exciting electrode formed on a surface of each of the arm portions, and has a structure suitable for being built into a pressure sensor as a pressure sensitive element. A double-ended tuning fork type piezoelectric resonator includes: a piezoelectric element 3 having two arm portions 4 disposed in parallel and apart from each other, and a first supporting portion 5 and a second supporting portion 6 that respectively support one ends and the other ends of each of the arm portions; and an exciting electrode 7 formed on a surface of each arm portion. In the resonator, an annular linking piece 8 is provided to link the first and the second supporting portions to dispose the two arm portions in an internal space of the annular linking piece.

7 Claims, 5 Drawing Sheets

U.S. PATENT DOCUMENTS

| | | | |
|---|---|---|---|
| 5,458,000 A * | 10/1995 | Burns et al. | 73/708 |
| 5,701,048 A * | 12/1997 | Kaida | 310/321 |
| 5,844,141 A | 12/1998 | Stansfeld | |
| 6,084,257 A * | 7/2000 | Petersen et al. | 257/254 |
| 6,812,413 B1 * | 11/2004 | Kats et al. | 177/210 R |
| 7,290,453 B2 * | 11/2007 | Brosh | 73/720 |
| 7,490,519 B2 * | 2/2009 | Subramanian et al. | 73/716 |

FOREIGN PATENT DOCUMENTS

| | | |
|---|---|---|
| JP | A-56-119519 | 9/1981 |
| JP | A-59-131135 | 7/1984 |
| JP | A-63-5228 | 1/1988 |
| JP | A-64-29110 | 1/1989 |
| JP | A-64-86608 | 3/1989 |
| JP | A-5-19795 | 1/1993 |
| JP | A-7-50539 | 2/1995 |
| JP | B2-7-109970 | 11/1995 |
| JP | A-9-297082 | 11/1997 |
| JP | A-2005-121628 | 5/2005 |

* cited by examiner

DOUBLE-ENDED TUNING FORK TYPE PIEZOELECTRIC RESONATOR AND PRESSURE SENSOR

FIELD OF THE INVENTION

The present invention relates to a double-ended tuning fork type piezoelectric resonator and a pressure sensor using the same.

BACKGROUND TECHNOLOGY

Conventionally, a pressure sensor using a crystal resonator is known as a detection element used in gauges such as a water pressure gauge, an air gauge, and a differential pressure gauge. The crystal resonator includes an electrode pattern formed on a plate-like quartz substrate. By taking advantage of the characteristics of the crystal resonator that its resonant frequency varies when pressure is applied in the axial direction, the pressure sensor is made to detect pressure changes.

With the pressure sensor using the crystal resonator, the resonant frequency varies in approximate proportion to an applied pressure (showing a quadratic curve). Thus, by compensating the relation between the frequency variation and the applied pressure by using a quadratic equation, high-accuracy pressure measurement becomes possible.

However, in an attempt to realize the high-accuracy pressure measurement, problems occur that the structure becomes complicated and the manufacturing cost becomes higher. That is, a conventional pressure sensor disclosed in Patent Document 1 includes: a case provided with a first and a second pressure input orifices respectively disposed on two wall surfaces facing each other and maintained in a vacuum or inert atmosphere on the inside, a first electro-deposited bellow whose one end opening side is fixed on a first wall surface and a second electro-deposited bellow whose one end opening side is fixed on a second wall surface, a force transmitting member interposed between the other ends of both bellows, a resonator supporting member joined to the force transmitting member via a flexure hinge, and a plate-like crystal resonator whose both ends are each supported by the force transmitting member and the resonator supporting member. The resonator supporting member is fixed, at its base, on the inner wall of the case and is equipped with the flexure hinge (a pivot) at the part joined to the force transmitting member.

With this conventional example, it is necessary to use the electro-deposited bellows having a very small spring constant to convert gas and liquid pressure into a mechanical force and the flexure hinge with slim constricted parts. Because of high cost of these parts, the cost of the whole product becomes inevitably high.

Further, for price reduction, a system using inexpensive molded bellows and the force transmitting member having no flexure hinge is proposed. However, the pressure sensor of this type has a disadvantage in that, as the applied pressure increases, a bending stress component is applied to the crystal resonator in addition to the axial force. Thus, a linear frequency variation (the quadratic equation) cannot be obtained, and a relation of a cubic curve having a third-order coefficient is produced. Thus, the method of compensating the relationship between the frequency variation and the applied pressure by the quadratic equation suffers a disadvantage that it decreases the accuracy.

In order to solve the problems, the applicant proposed a pressure sensor in Patent Document 2. The sensor includes an air-tight case in which two inexpensive molded bellows having a cylindrical shape are disposed in series or coaxially and a crystal resonator is supported by a pedestal disposed between the ends of both bellows.

However, it has been known that the pressure sensor of this type has a disadvantage in that it has a weak strength against an impact from a direction (an X-axis direction) perpendicular to the axial direction of the cylindrical bellows.

Then, the applicant proposed a double-ended tuning fork type piezoelectric resonator having a thin plate shape in Patent Document 3. In the resonator, two vibration portions having a narrow width strip shape are disposed in parallel with a slit interposed there between, and each of the both ends of the vibration portions is supported by a supporting member having a large area with a connecting member having a small area that is interposed therebetween. The double-ended tuning fork type piezoelectric resonator used in a pressure sensor as a pressure sensitive element allow sensors to be downsized, simplified, achieve low costs, and have high sensitivity since it does not need complicated mechanical elements such as bellows and oscillating arms.

The double-ended tuning fork piezoelectric resonator has a structure in which the connecting member and the supporting member are respectively provided in series at the both ends of two vibration portions. Thus, it is necessary to hold the double-ended tuning fork piezoelectric resonator in a stretched condition in an air-tight space formed in two quartz diaphragms. This may complicate a supporting structure and increase assembly man-hours.

[Patent Document 1] Japanese Unexamined Patent Application Publication No. 56-119519.
[Patent Document 2] Japanese Unexamined Patent Application Publication No. 2005-121628.
[Patent Document 3] Japanese Examined Patent Application Publication No. 7-109970.

DISCLOSURE OF THE INVENTION

In consideration of the above, the present invention aims to provide a double-ended tuning fork type piezoelectric resonator that includes: a piezoelectric element having two arm portions disposed in parallel, and a first supporting portion that support one ends of each of the arm portions, a second supporting portion that support the other ends of each of the arm portions; and an exciting electrode formed on a surface of each arm portion, and has a structure suitable for being built into a pressure sensor as a pressure sensitive element.

Further, it aims to provide a pressure sensor in which the double-ended tuning fork piezoelectric resonator is built into an air-tight space formed between diaphragm substrates.

In order to achieve the above object, a double-ended tuning type piezoelectric resonator according to the invention defined in claim 1 is characterized in that the resonator includes: a piezoelectric element having two arm portions that are disposed in parallel and apart from each other, a first supporting portion that support one ends of each of the arm portions and a second supporting portion that support the other ends of each of the arm portions; and an exciting electrode formed on a surface of each arm portion, and an annular linking piece is provided to link the first and the second supporting portions to dispose the two arm portions in an internal space of the annular linking piece.

A pressure sensor according to the invention defined in claim 2 is characterized in that the sensor includes: the double-ended tuning fork type piezoelectric resonator according to Claim 1; and a first diaphragm substrate and a second diaphragm substrate that air-tightly seal the two arm portions by respectively being bonded to a front surface side and a back surface side of the double-ended tuning fork type piezoelectric resonator, and the first and the second diaphragm substrates are respectively bonded to a front surface and a back surface of the annular linking piece of the double-ended tuning fork type piezoelectric resonator to house the two arm portions in an air-tight space formed in an internal space of the annular linking piece without making contact with an inside wall of the air-tight space.

The invention defined in claim 3 is characterized in that, in claim 2, the first and the second diaphragm substrates include: plate-like portions that are faced and disposed apart from each other to a front surface side and a back surface side of the two arm portions; and annular thick portions each of which is provided at an outer circumference end of each of the plate-like portions and that are respectively tightly bonded to the front and the back surfaces of the annular linking piece.

The invention defined in claim 4 is characterized in that, in claim 2, the annular linking piece has a thickness larger than a thickness of the two arm portions, and the first and the second diaphragm substrates include plate-like portions that are faced and disposed apart from each other to a front surface side and a back surface side of the two arm portions, and an inside surface along the outer circumference end of each plate-like portion is respectively tightly bonded to the front and the back surfaces of the annular linking piece having the thick thickness.

The invention defined in claim 5 is characterized in that, in any one of claims 2 through 4, a recess is formed on an outer side surface of each of the first and the second diaphragm substrates to concentrate a tensile stress to the two arm portions when a pressure is applied.

According to the invention, in a double-ended tuning fork type piezoelectric resonator that include: a piezoelectric element having two arm portions disposed in parallel, a first supporting portion that support one ends of each of the arm portions and second supporting portion that support the other ends of each of the arm portions; and an exciting electrode formed on a surface of each arm portion, an annular linking piece is provided to link the first and the second supporting portions to disposed the two arm portions in an internal space of the annular linking piece. This can provide one having a structure suitable for being built into a pressure sensor as a pressure sensitive element.

Further, a pressure sensor can be provided in which the double-ended tuning fork piezoelectric resonator is built into an air-tight space formed between diaphragm substrates.

DESCRIPTION OF PREFERRED EMBODIMENT

Hereinafter, the invention will be described in detail based on embodiments shown in drawings.

Figure 1A:
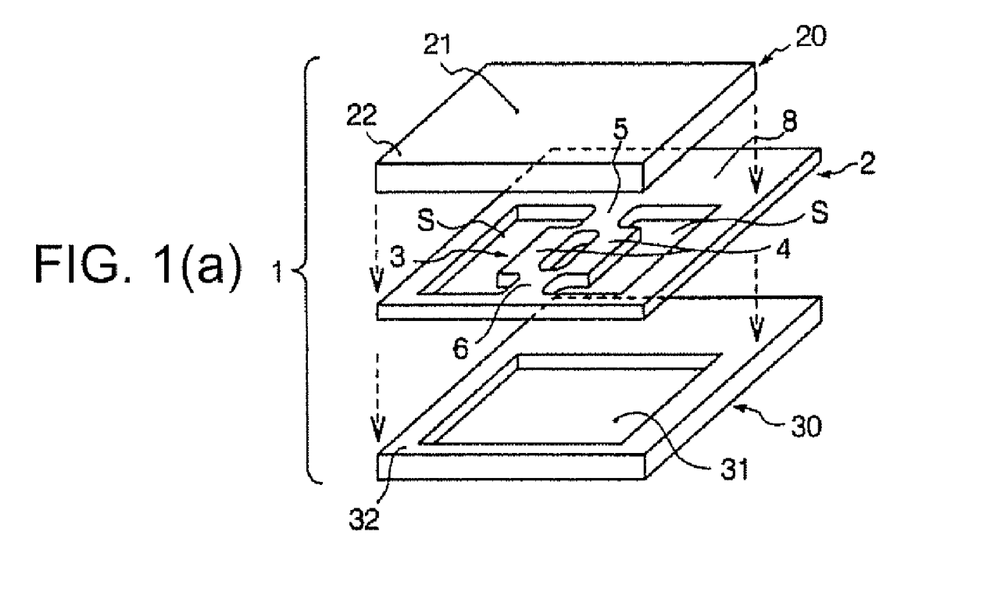
FIG. 1a is an exploded perspective view of a pressure sensor made by using a double-ended tuning fork type piezoelectric resonator according to an embodiment of the invention.
Figures 1B, 1C:
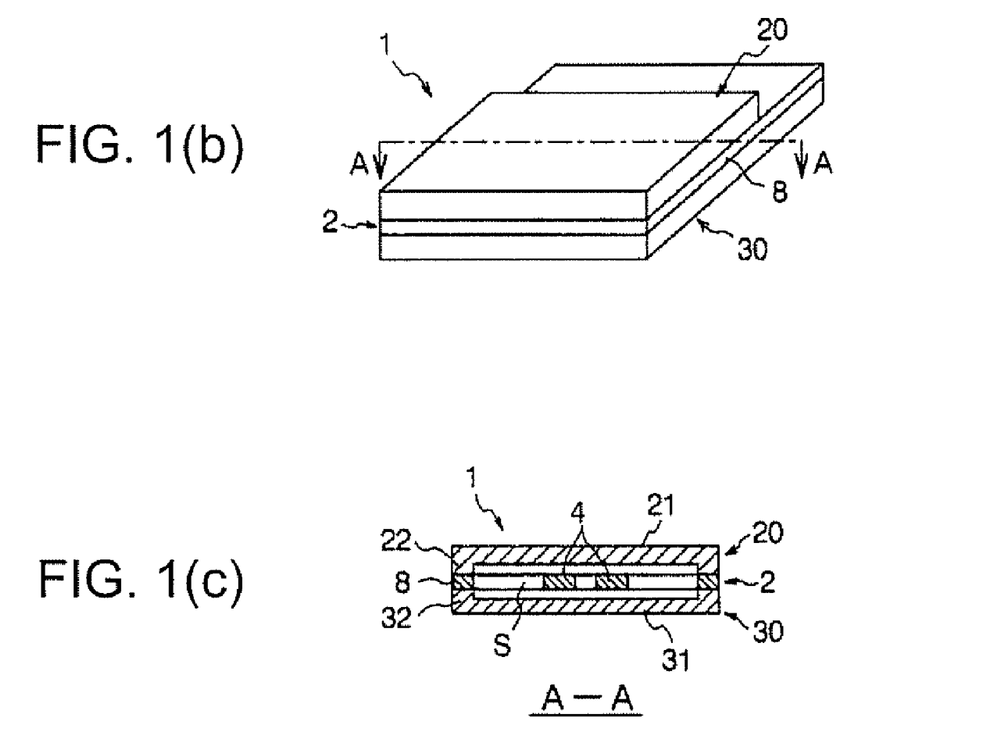
FIG. 1b is an external view showing an assembly state of each constituent element.
FIG. 1c is a sectional view taken along A-A of FIG. 1b.
Figure 2A:
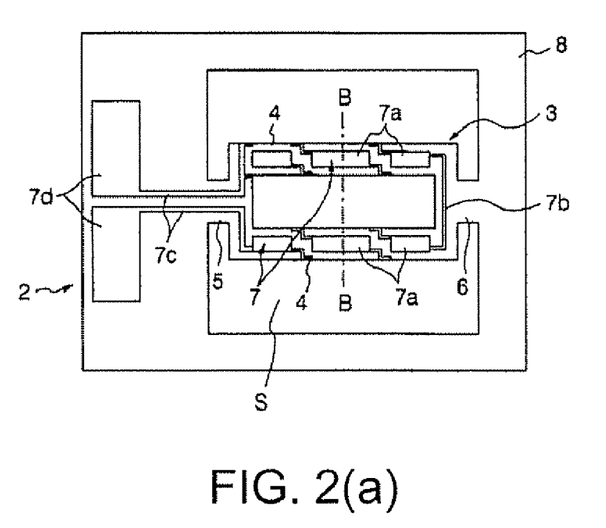
FIG. 2a is a plan view of the double-ended tuning fork type piezoelectric resonator.
Figure 2B:
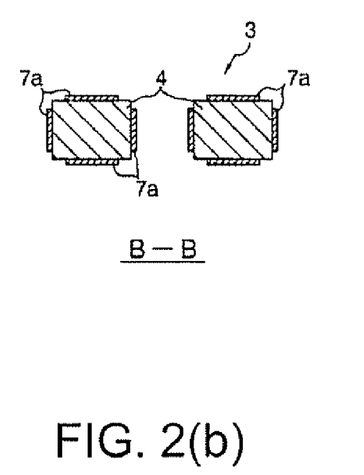
FIG. 2b is a sectional view taken along B-B.
Figures 3A, 3B:
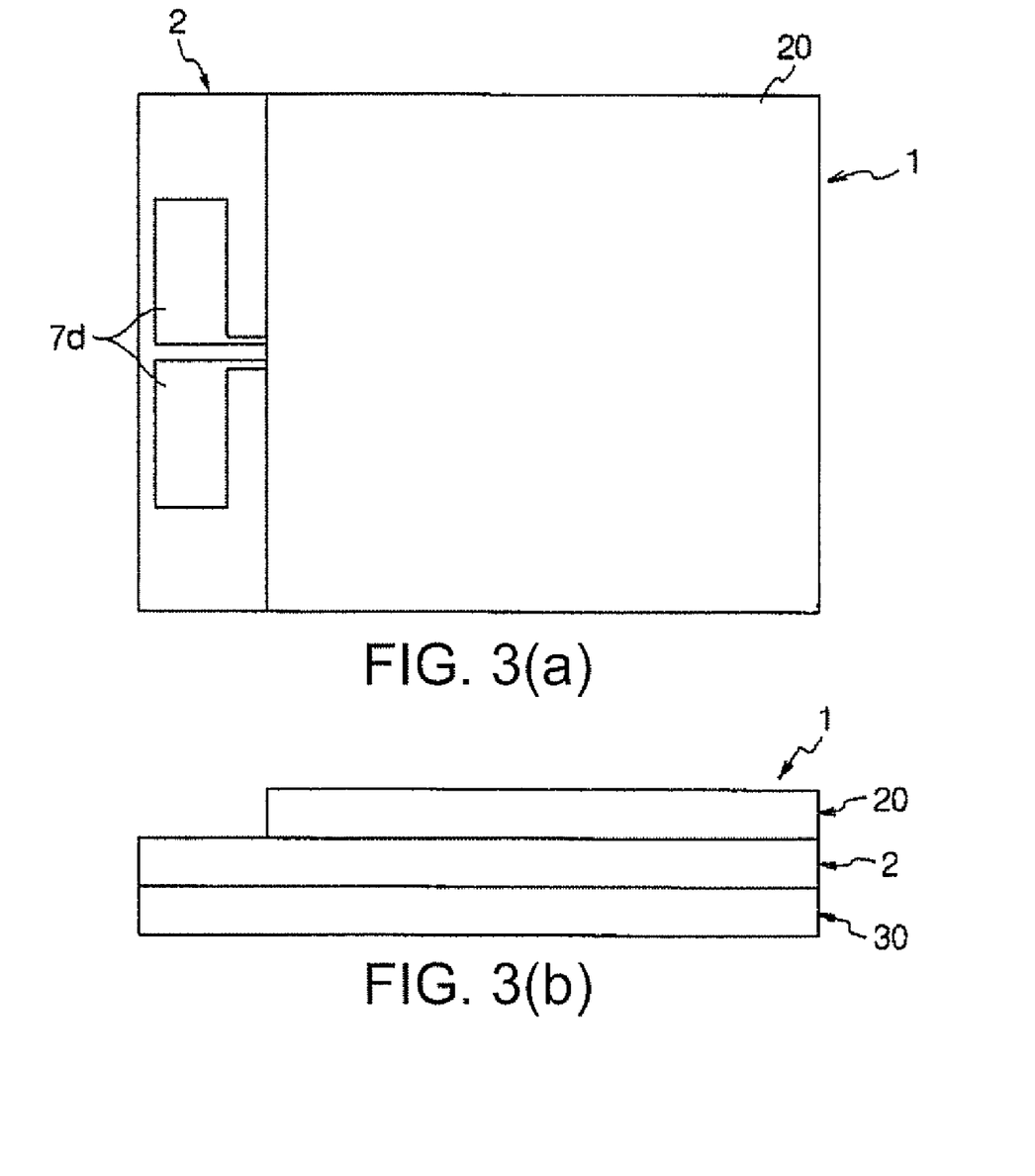
FIG. 3a is a plan view and FIG. 3b is an elevation view showing an assembly state of the pressure sensor.

FIG. 1a is an exploded perspective view of a pressure sensor made by using a double-ended tuning fork type piezoelectric resonator according to an embodiment of the invention. FIG. 1b is an external view showing an assembly state of each constituent element. FIG. 1(c) is a sectional view taken along A-A of FIG. 1b. FIG. 2a is a plan view of the double-ended tuning fork type piezoelectric resonator. FIG. 2b is a sectional view taken along B-B. FIG. 3a is a plan view and FIG. 3b is an elevation view showing an assembly state of the pressure sensor.

A pressure sensor 1 has a structure in which a double-ended tuning fork type piezoelectric resonator 2 is layered and integrated with a first diaphragm substrate 20 and a second diaphragm substrate 30 in a sandwiched state. That is, the pressure sensor 1 is provided with the double-ended tuning fork type piezoelectric resonator 2, and the first and second diaphragm substrates 20 and 30, which are respectively bonded to the front and the back surfaces of an annular linking piece 8 forming an outer circumference portion of the double-ended tuning fork type piezoelectric resonator 2 to form an air-tight space S formed in an internal space S of the annular linking piece 8, and house two arm portions 4 without making contacting with the inside wall of the air-tight space. In this case, while the double-ended tuning fork type piezoelectric resonator 2 and the second diaphragm substrate 30 are structured so that each profile line is matched, the first diaphragm substrate 20 is formed in a short dimension so as to expose the upper surface at one end side of the double-ended tuning fork type piezoelectric resonator 2. On the one end overhung surface, a pad 7d of a lead pattern for external conducting, which will be described later, is exposed and disposed.

The double-ended tuning fork type piezoelectric resonator 2 includes: a piezoelectric element 3 having two arm portions (vibration portions) 4 that are disposed in parallel and are made of a piezoelectric material such as quartz, and a first supporting portion 5 and a second supporting portion 6 each of which supports and integrally links respective both ends in the longitudinal direction of each arm portion 4; an exiting electrode 7 formed on the surface of each arm portion 4; and the annular linking piece 8 provided to link the first and second supporting portions 5 and 6. The two arm portions 4 are disposed in the internal space S of the annular linking piece 8. The thicknesses of each arm portion 4, the first and second supporting portions 5 and 6, and the annular linking piece 8 are equal.

In the embodiment, the exciting electrode 7 includes a main pattern 7a formed to each of four faces of each arm portion 4 having a rectangular shape cross section as shown in FIG. 2b, a lead pattern 7b connecting one ends of each main pattern 7a at a side adjacent to the second supporting portion 6, a lead pattern 7c led on the annular linking piece 8 from the respective other ends of each main pattern 7a, and the pad 7d positioned at the end portion of each lead pattern 7c. Each pad 7d is exposed and disposed on the overhung surface overhung from the one end edge of the double-ended tuning fork type piezoelectric resonator 2.

The first diaphragm substrate 20 includes a plate-like portion 21, and an annular thick portion 22 while the second diaphragm substrate 30 includes a plate-like portion 31, and an annular thick portion 32. The plate-like portions 21 and 31 are faced and disposed apart from each other on the front and the back surfaces of two arm portions. The annular thick portion 22 and 32 are disposed at the outer circumference end of each of the plate-like portions 21 and 31, and respectively tightly bonded to the front and the back surfaces of the annular linking piece 8. The first and second diaphragm substrates 20 and 30 are made of a piezoelectric material such as quartz.

In the pressure sensor 1 according to the embodiment, the piezoelectric element 3, which is included in the double-ended tuning fork type piezoelectric resonator 2, has an even thickness, and the annular thick portions 22 and 32, which are integrated with the outer circumference ends of the plate-like portions 21 and 31 of the first and second diaphragm substrates 20 and 30, are tightly bonded to the front and the back surfaces of the annular linking piece 8 of the double-ended tuning fork type vibration element 2. This allows the annular thick portions 22 and 32 to function as a spacer to form the air-tight space S. That is, each arm portion 4 can be free from making contact with the plate-like portions 21 and 31 forming the air-tight space inner wall in the air-tight space, securing the free vibrations. As a result, a pressure sensitive element can function with high sensitivity.

In addition, the pressure sensor 1 is housed in a casing (not shown). A pressure is applied from a pressure introducing hole provided to the casing to the outer surfaces of the diaphragm substrates 20 and 30 inside the casing. The pressure applied to the outer surface of each of the diaphragm substrates 20 and 30 bends the diaphragm inwardly to produce an outward stress at the peripheral portion. This stress produces a force tensioning in the longitudinal axis direction of each arm portion 4 to increase the resonance frequency, allowing the applied pressure to be detected as an electrical signal.

The pad 7d exposed and disposed on the one end overhung portion of the annular linking piece 8 serves as an input-output terminal to the main pattern 7a, and is used as a lead terminal for external conducting of the sensor.

As above described, the double-ended tuning fork type piezoelectric resonator 2 has an annular structure suitable for being built into a pressure sensor as a pressure sensitive element. This makes easy to made pressure sensors. That is, the diaphragm substrates 20 and 30 integrally bonded to the annular linking piece 8 of the double-ended tuning fork type piezoelectric resonator 2 can improve assembly workability, and achieve downsizing and low costs by reducing the number of parts. In addition, the simplified structure can achieve drastic improvement effects on shock resistance and anti-vibration characteristics. As a result, the reliability can be improved.

Further, influences due to external temperature changes can be reduced by air-tightly sealing the arm portions 4 serving as a pressure sensitive element with the diaphragm substrates made of quartz.

Figure 4A:
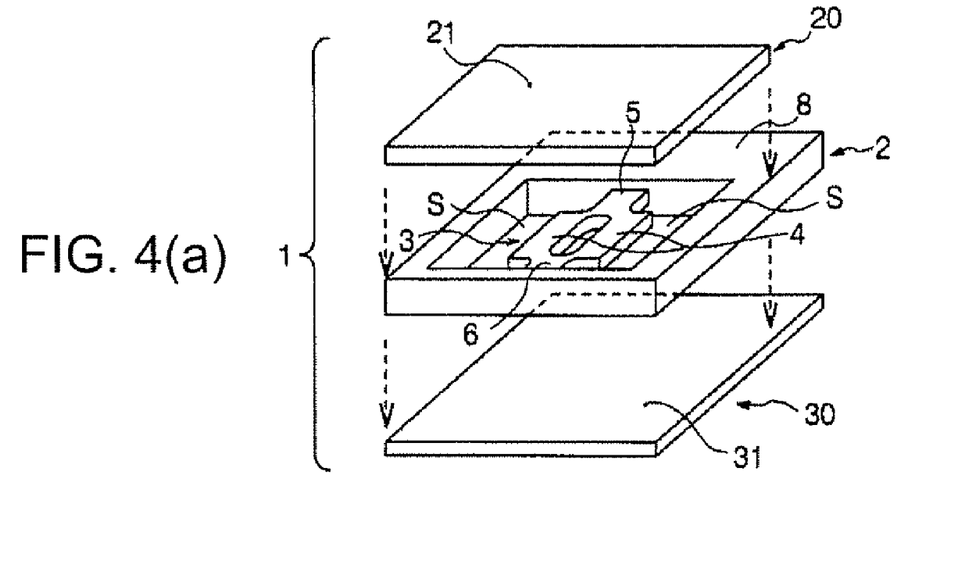
FIG. 4a is an exploded perspective view of a pressure sensor made by using a double-ended tuning fork type piezoelectric resonator according to another embodiment of the invention.
Figure 4B:
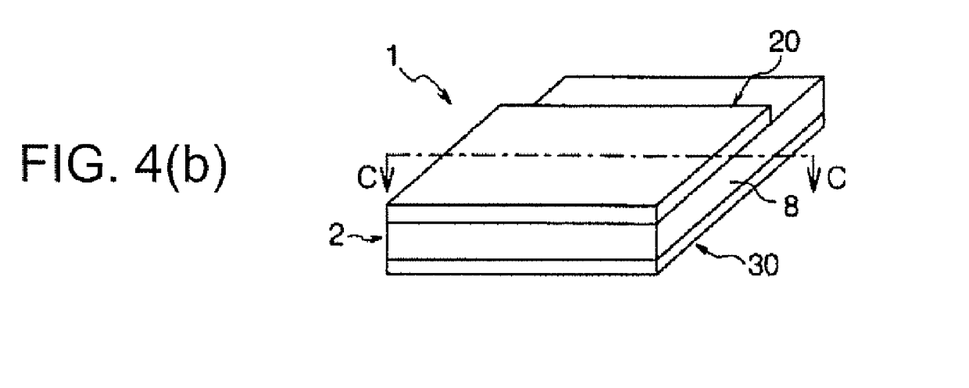
FIG. 4b is an external view showing an assembly state of each constituent element.
Figure 4C:
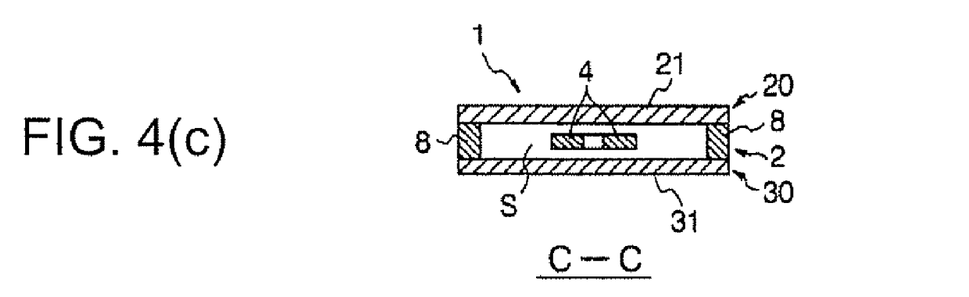
FIG. 4c is a sectional view taken along C-C of FIG. 4b.

Next, FIG. 4a is an exploded perspective view of a pressure sensor made by using a double-ended tuning fork type piezoelectric resonator according to another embodiment of the invention. FIG. 4b is an external view showing an assembly state of each constituent element. FIG. 4c is a sectional view taken along C-C in FIG. 4b. The same part of each constituent element of the pressure sensor in FIG. 1 is given the same numeral and described. Here, the structural view of the double-ended tuning fork type piezoelectric element shown in FIG. 2, and the explanatory view of the pressure sensor in the assembly state shown in FIG. 3 are used for describing this embodiment as it is.

A double-ended tuning fork type piezoelectric resonator 2 according to the embodiment includes the arm portions 4 each having a thickness thinner than that of the annular linking piece 8 positioned at the periphery. On the other hands, at least one of the first and second diaphragm substrates 20 and 30 is composed of only the plate-like portions 21 and 31 that are faced and disposed apart from each other to the front and the back surface sides of the two arm portions 4 of the double-ended tuning fork type piezoelectric resonator (the annular thick portions 22 and 23 in the embodiment of FIG. 1 are not included). Because of this, the inside surface along the outer circumference end of each of the plate-like portions 21 and 31 is respectively tightly bonded to the front and the back surface sides of the annular linking piece 8 having a thick thickness. This allows the air-tight space S having an enough width in up-down direction between the diaphragm substrates 20 and 30 to be formed. As a result, the arm portions 4 serving as a pressure sensitive element are provided apart from the air-tight inner wall, thereby enabling the free vibrations to be secured. Consequently, the detection sensitivity by the arm portions 4 can be increased.

The structure other than described above is the same as the embodiment of FIG. 1.

Figure 5A:
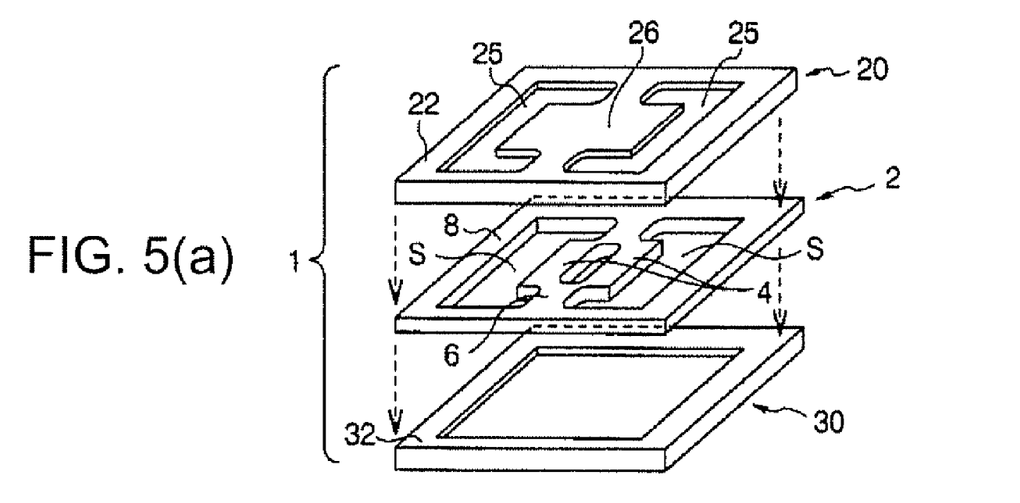
FIG. 5a is an exploded perspective view of a pressure sensor made by using a double-ended tuning fork type piezoelectric resonator according to still another embodiment of the invention.
Figure 5B:
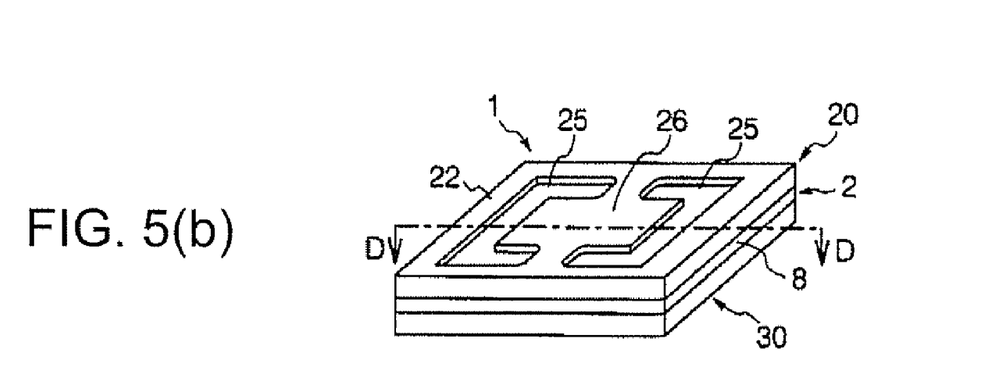
FIG. 5b is an external view showing an assembly state of each constituent element.
Figure 5C:
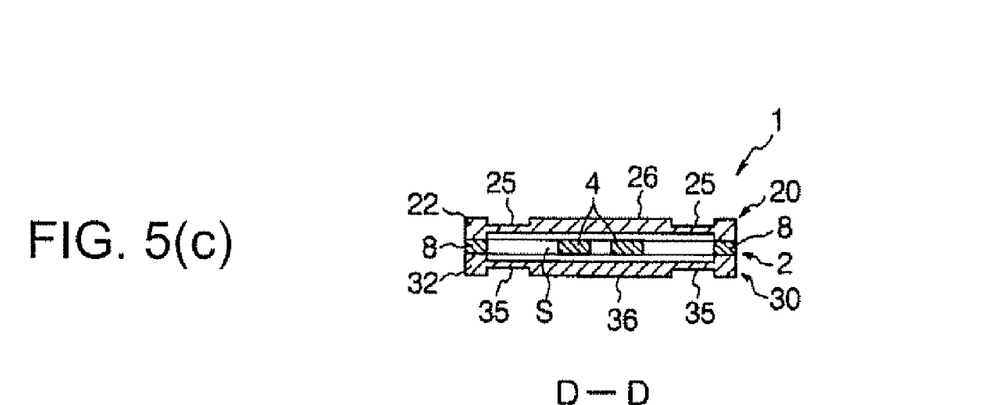
FIG. 5c is a sectional view taken along D-D of FIG. 5b.

Next, FIG. 5a is an exploded perspective view of a pressure sensor made by using a double-ended tuning fork type piezoelectric resonator according to still another embodiment of the invention. FIG. 5b is an external view showing an assembly state of each constituent element. FIG. 5c is a sectional view taken along D-D in FIG. 5b. The same part of each constituent element of the pressure sensor in FIG. 1 is given the same numeral and described. Here, the structural view of the double-ended tuning fork type piezoelectric element shown in FIG. 2, and the explanatory view of the pressure sensor in the assembly state shown in FIG. 3 are used for describing this embodiment as it is.

The double-ended tuning fork type piezoelectric resonator 2 included in the pressure sensor 1 according to the embodiment has the arm portions 4 each having the same thickness of that of the annular linking piece 8 in the same way of the double-ended tuning fork type piezoelectric resonator 2 according to the embodiment of FIG. 1. On the other hands, the first diaphragm substrate 20 has the annular thick portion 22 at the outer circumference end, and a recess 25 on the outer side surface of the diaphragm substrate in order to concentrate a tensile stress to two arm portions when a pressure is applied and a thick portion 26 while the second diaphragm substrate 30 has the annular thick portion 32 at the outer circumference end, and a recess 35 on the outer side surface of the diaphragm substrate in order to concentrate a tensile stress to two arm portions when a pressure is applied and a thick portion 36.

As a result of symmetrically arranging two recesses 25 having a reversed-squared-C shape to the outer side surface of the first diaphragm substrate 20 and two recesses 35 having a reversed-squared-C shape to the outer side surface of the second diaphragm substrate 30, each of the plate-like portions 21 and 31, which face each arm portion 4, partially has a thick portion, and a thin portion is formed at the bottom surface in each recess having the reversed-squared-C shape. As described above, the diaphragm substrate 20 has the thin portion 25 and the thick portion 26 while the diaphragm substrate 30 has the thin portion 35 and the thick portion 36. This can increase pressure detection sensitivity when a pressure is applied to the outer surfaces of the diaphragms since the tensile stress applied in the longitudinal axis direction of each arm portion 4 is concentrated.

The entire disclosure of Japanese Patent Application No. 2005-278932, filed Sep. 26, 2005 expressly incorporated by reference herein.

The invention claimed is:

1. A double-ended tuning fork type piezoelectric resonator, comprising:
    a piezoelectric element having two arm portions that are disposed in parallel and apart from each other, the two arm portions each having a first end and a second end, a first supporting portion that directly connects to the first ends of the two arm portions, and a second supporting portion that directly connects to the second ends of the two arm portions; and
    an exciting electrode formed on a surface of each of the arm portions, wherein an annular linking piece is provided to link the first and the second supporting portions to dispose the two arm portions in an internal space of the annular linking piece.

2. A pressure sensor, comprising the double-ended tuning fork type piezoelectric resonator according to claim 1; and
    a first diaphragm substrate and a second diaphragm substrate that air-tightly seal the two arm portions by respectively being bonded to a front surface side and a back surface side of the double-ended tuning fork type piezoelectric resonator, wherein the first and the second diaphragm substrates are respectively bonded to a front surface and a back surface of the annular linking piece of the double-ended tuning fork type piezoelectric resonator to house the two arm portions in an air-tight space formed in an internal space of the annular linking piece without making contact with an inside wall of the air-tight space.

3. The pressure sensor according to claim 2, wherein the first and the second diaphragm substrates include:
    plate-like portions that are faced and disposed apart from each other to a front surface side and a back surface side of the two arm portions; and
    annular thick portions each of which is provided at an outer circumference end of each of the plate-like portions and that are respectively tightly bonded to the front and the back surfaces of the annular linking piece.

4. The pressure sensor according to claim 2, wherein the annular linking piece has a thickness larger than a thickness of the two arm portions, and wherein the first and the second diaphragm substrates include plate-like portions that are faced and disposed apart from each other to a front surface side and a back surface side of the two arm portions, and an inside surface along the outer circumference end of each of the plate-like portions is tightly bonded to the front and the back surfaces of the annular linking piece having the thick thickness.

5. The pressure sensor according to claim 2, further comprising a recess formed on an outer side surface of each of the first and the second diaphragm substrates to concentrate a tensile stress to the two arm portions when a pressure is applied.

6. The pressure sensor according to claim 3, further comprising a recess formed on an outer side surface of each of the first and the second diaphragm substrates to concentrate a tensile stress to the two arm portions when a pressure is applied.

7. The pressure sensor according to claim 4, further comprising a recess formed on an outer side surface of each of the first and the second diaphragm substrates to concentrate a tensile stress to the two arm portions when a pressure is applied.

* * * * *